(12) United States Patent
Hayakawa

(10) Patent No.: US 7,592,848 B2
(45) Date of Patent: Sep. 22, 2009

(54) OFFSET ADJUSTING APPARATUS

(75) Inventor: Yasumasa Hayakawa, Gunma-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/766,684

(22) Filed: Jun. 21, 2007

(65) Prior Publication Data

US 2007/0296481 A1    Dec. 27, 2007

(30) Foreign Application Priority Data

Jun. 21, 2006    (JP)    .............................. 2006-171794

(51) Int. Cl.
*H03L 5/00*    (2006.01)
*H03F 3/45*    (2006.01)
(52) U.S. Cl. ..................... 327/307; 327/561; 330/260
(58) Field of Classification Search ......... 327/306–307, 327/362, 561–563; 330/260–261
See application file for complete search history.

(56) References Cited

U.S. PATENT DOCUMENTS 4,377,759 A * 3/1983 Ohhata et al. ............... 327/337
6,674,328 B2 * 1/2004 Uto et al. ..................... 330/259

FOREIGN PATENT DOCUMENTS

JP    411271364 A * 10/1999
JP    2001044770 A * 2/2001
JP    2004-348843    12/2004
JP    2004-348908    12/2004
KR    10-2000-0041301    7/2000

OTHER PUBLICATIONS

Korean Intellectual Property Office, Notification of Submission of Opinions for Application No. 10-2007-60437 entitled Offset Adjusting Apparatus, mailing date Jul. 22, 2008.

* cited by examiner

*Primary Examiner*—Dinh T. Le
(74) *Attorney, Agent, or Firm*—SoCal IP Law Group LLP; Steven C. Sereboff; John E. Gunther

(57) ABSTRACT

An offset adjusting apparatus adjusting an offset of an output signal output from an output terminal of an operational amplifier including one input terminal to which an input signal is to be input via a first resistor and the other input terminal to which a reference voltage is to be applied, the operational amplifier being connected between the one input terminal and the other output terminal, the offset adjusting apparatus comprising: an adjustment resistor configured to be capable of adjusting a resistance value, the adjustment resistor including one end to which an adjustment voltage for adjusting the offset is to be applied and the other end connected to the one input terminal of the operational amplifier; and a controlling unit configured to control the adjustment voltage applied to the adjustment resistor based on a DC level of the output signal to remove the offset.

18 Claims, 10 Drawing Sheets

OFFSET ADJUSTING APPARATUS

CROSS-REFERENCE TO RELATED APPLICATION

This application claims the benefit of priority to Japanese Patent Application No. 2006-171794, filed Jun. 21, 2006, of which full contents are incorporated herein by reference.

BACKGROUND OF THE INVENTION

1. Field of the Invention

The present invention relates to an offset adjusting apparatus.

2. Description of the Related Art

An offset adjusting apparatus is used for an apparatus that removes a DC offset included in an analogue signal. For example, Japanese Patent Application Laid-Open Publication No. 2004-348908 discloses an offset adjusting apparatus that removes an offset of an RF signal in a circuit that generates an RF signal from a signal output from an optical pickup of an optical disk apparatus.

FIG. 14 depicts a configuration of an offset adjusting apparatus equivalent to an apparatus disclosed in Japanese Patent Application Laid-Open Publication No. 2004-348908. An offset adjusting apparatus 100 includes an operational amplifier 110, resistors 111, 112, a low-pass filter (LPF) 113, an A/D converter 114, a voltage controlling unit 115, a D/A converter 116, and a CPU 120.

An input signal $V_{IN}$ input to the offset adjusting apparatus 100 is a signal output from an optical pickup, for example. Since the signal output from the optical pickup is weak, the offset adjusting apparatus 100 outputs an output signal $V_O$ acquired by amplifying the input signal $V_{IN}$ with a gain corresponding to a ratio of resistance values of the resistors 111 and 112. When the resistance value of the resistor 111 is $R_1$ and the resistance value of the resistor 112 is $R_f$, the gain in the offset adjusting apparatus 100 is represented as $R_f/R_1$. To set the amplitude level of the output signal $V_O$ to a predetermined level, the resistor value $R_f$ of the resistor 112 is adjusted under the control of the CPU 120 to change the gain of the offset adjusting apparatus 100.

The input signal $V_{IN}$ includes an offset due to the characteristics of the optical pickup, etc. The operational amplifier 110 also generates an offset. If the offset stays in the output signal $V_O$, subsequent processes may be affected. Therefore, the offset adjusting apparatus 100 controls a voltage applied to the + input terminal of the operational amplifier 110 to remove the offset included in the output signal $V_O$.

The operation of removing the offset in the offset adjusting apparatus 100 will be described. First, the LPF 113 detects a DC level of the output signal $V_O$. The detected DC level is converted by the A/D converter 114 into a digital signal, which is input to the voltage controlling unit 115. Under the control of the CPU 120, the voltage controlling unit 115 outputs the control data for controlling the voltage applied to the + input terminal of the operational amplifier 110 after increasing or decreasing the control data by one step such that the offset of the output signal $V_O$ is removed. The D/A converter 116 generates a voltage $V_{DA}$ acquired by analog conversion of the control data output from the voltage controlling unit 115 and applies the voltage $V_{DA}$ to the + input terminal of the operational amplifier 110. Until the offset of the output signal $V_O$ is removed, i.e., until the DC level of the output signal $V_O$ attains a predetermined target level, the voltage controlling unit 115 repeatedly changes the control data.

In the offset adjusting apparatus 100, the relation of the following equation (1) is satisfied.

$$\frac{V_{IN} - V_{DA}}{R_1} = \frac{V_{DA} - V_O}{R_f} \quad (1)$$

From equation (1), the output signal $V_O$ is represented by the following equation (2).

$$V_o = V_{DA} - \frac{R_f}{R_1}(V_{IN} - V_{DA}) = \left(1 + \frac{R_f}{R_1}\right)V_{DA} - \frac{R_f}{R_1}V_{IN} \quad (2)$$

Therefore, a change amount $\Delta V_O$ of the output signal $V_O$ corresponding to a change amount $\Delta V_{DA}$ of the voltage $V_{DA}$ is represented by the following equation (3).

$$\Delta V_o = \left(1 + \frac{R_f}{R_1}\right)\Delta V_{DA} \quad (3)$$

$R_f/R_1$ included in equation (3) represents the gain in the offset adjusting apparatus 100. That is, $\Delta V_O$ becomes large when the gain of the offset adjusting apparatus 100 is large and $\Delta V_O$ becomes small when the gain of the offset adjusting apparatus 100 is small. In other words, the offset adjustment accuracy in the offset adjusting apparatus 100 is fluctuated by the gain.

FIG. 15 depicts an example of an offset adjustment sequence for the output signal $V_O$ in accordance with the gain of the offset adjusting apparatus 100. It is assumed that the adjustment of the offset is started at time T1 and that the voltage $V_{DA}$ is reduced stepwise under the control of the voltage controlling unit 115. When the voltage $V_{DA}$ is reduced by one step, the change amount of the DC level of the voltage $V_O$ is changed in accordance with the gain ($R_f/R_1$) of the offset adjusting apparatus 100 as described above. Therefore, if the gain ($R_f/R_1$) of the offset adjusting apparatus 100 is large, the adjustment accuracy of the offset is deteriorated. As a result, a difference becomes larger between the DC level of the output voltage $V_O$ and the target level $V_{REF}$ and the result of the offset adjustment may also be deteriorated.

The following equation (4) is derived from equation (2) as a condition of removing the offset of the output signal $V_O$.

$$V_{DA} = \frac{R_f}{R_1 + R_f}V_{IN} \quad (4)$$

When the gain ($R_f/R_1$) of the offset adjusting apparatus 100 is represented by G, the condition of removing the offset of the output signal $V_O$ can be represented by the following equation (5).

$$V_{DA} = \frac{R_1 G}{R_1 + R_f G}V_{IN} = \frac{G}{1+G}V_{IN} = \frac{1}{\frac{1}{G}+1}V_{IN} \quad (5)$$

Assuming that the dynamic range of the voltage $V_{DA}$ is $-A \leq V_{DA} \leq A$, the following equation (6) indicates an offset adjustment allowable range, which is a range of the input signal $V_{IN}$ enabling removal of the offset of the output signal $V_O$.

$$-\left(1+\frac{1}{G}\right)A \leq V_{IN} \leq \left(1+\frac{1}{G}\right)A \quad (6)$$

As can be seen from equation (6), the input offset adjustment allowable range of the offset adjusting apparatus 100 is reduced as the gain G increases. Therefore, the offset of the output signal $V_O$ may not be removed in the offset adjusting apparatus 100 if the gain is increased.

The present invention was conceived in view of the above problems and it is therefore the object of the present invention to provide an offset adjusting apparatus having offset adjustment accuracy and offset adjustment allowable range that can be controlled regardless of the gain.

SUMMARY OF THE INVENTION

In order to solve the above problems, according to a major aspect of the present invention there is provided an offset adjusting apparatus adjusting an offset of an output signal output from an output terminal of an operational amplifier including one input terminal to which an input signal is to be input via a first resistor and the other input terminal to which a reference voltage is to be applied, the operational amplifier being connected between the one input terminal and the other output terminal, the offset adjusting apparatus comprising: an adjustment resistor configured to be capable of adjusting a resistance value, the adjustment resistor including one end to which an adjustment voltage for adjusting the offset is to be applied and the other end connected to the one input terminal of the operational amplifier; and a controlling unit configured to control the adjustment voltage applied to the adjustment resistor based on a DC level of the output signal to remove the offset.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

FIRST EMBODIMENT

Figure 1:
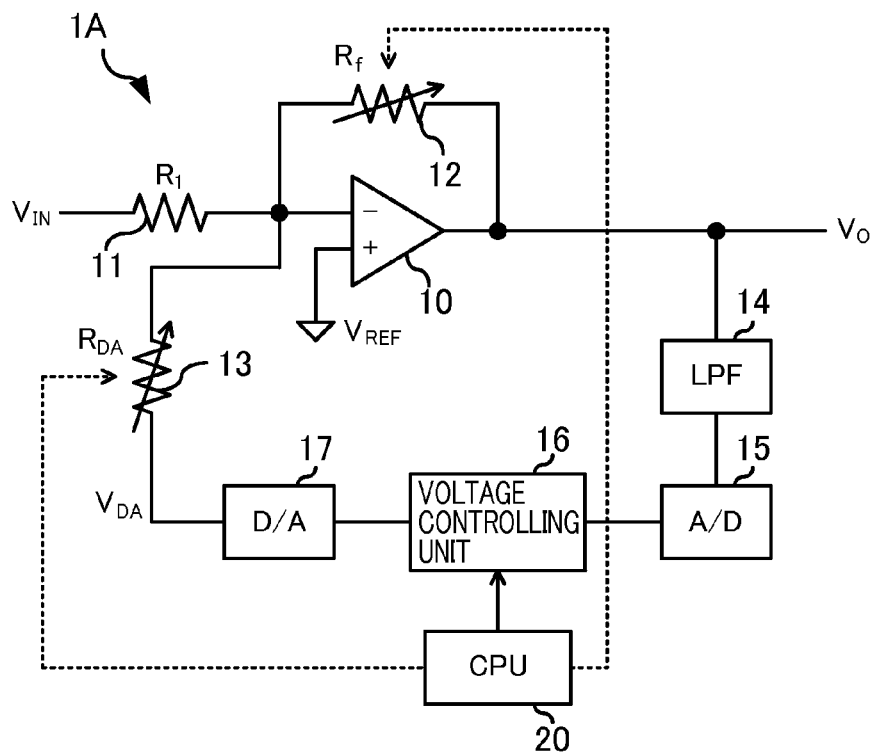
FIG. 1 is a diagram of a configuration of an offset adjusting apparatus in a first embodiment of the present invention.

FIG. 1 is a diagram of a configuration of an offset adjusting apparatus in a first embodiment of the present invention. An offset adjusting apparatus 1A includes an operational amplifier 10, resistors 11 to 13, a low-pass filter (LPF) 14, an A/D converter 15, a voltage controlling unit 16, a D/A converter 17, and a CPU (Central Processing Unit) 20.

The operational amplifier 10 is a circuit for amplifying an input signal $V_{IN}$ to output an output signal $V_O$. The input signal $V_{IN}$ is, for example, a weak-level signal output from an optical pickup of an optical disk apparatus. A predetermined reference voltage $V_{REF}$ is applied to the + input terminal of the operational amplifier 10 and the input signal $V_{IN}$ is applied to the − input terminal via the resistor 11.

The resistor 11 (first resistor) receives input of the input signal $V_{IN}$ through one end, and the other end is connected to the − input terminal of the operational amplifier 10. One end of the resistor 12 (second resistor) is connected to the − input terminal of the operational amplifier 10 and the other end is connected to the output terminal of the operational amplifier 10. One end of the resistor 13 (adjustment resistor) is applied with an adjustment voltage $V_{DA}$ output from the D/A converter 17, and the other end is connected to the − input terminal of the operational amplifier 10. It is assumed here that the resistance values of the resistors 11, 12, and 13 are represented by $R_1$, $R_f$, and $R_{DA}$, respectively. The resistors 12, 13 are variable resistors, and the resistance values $R_f$ and $R_{DA}$ can be controlled under the control of the CPU 20.

The LPF 14 configures a direct-current component output circuit that outputs the DC level (signal level of direct-current component) of the output signal $V_O$.

The A/D converter 15 converts the DC level output from the LPF 14 into a digital signal and outputs the digital signal.

The voltage controlling unit 16 calculates a target level of the adjustment voltage $V_{DA}$ that sets the DC level of the output signal $V_O$ to a predetermined level ($V_{REF}$), which is a condition of removing the DC offset of the output signal $V_O$, based on the digital signal output from the A/D converter 15. The voltage controlling unit 16 outputs to the D/A converter 17 the control data for setting the adjustment voltage $V_{DA}$ to the target level.

The D/A converter 17 outputs the adjustment voltage $V_{DA}$ acquired from analog conversion of the control data output from the voltage controlling unit 16.

The CPU 20 executes program stored in a memory (not shown) to adjust the resistance values of the resistors 12, 13 and to control the process of the voltage controlling unit 16.

The LPF 14, the A/D converter 15, the voltage controlling unit 16, the D/A converter 17, and the CPU 20 of the offset adjusting apparatus 1A correspond to a controlling unit of the present invention. The CPU 20 corresponds to a gain adjusting unit and an adjustment range controlling unit.

In the offset adjusting apparatus 1A, the relation of the following equation (7) is satisfied.

$$\frac{V_{IN} - V_{REF}}{R_1} + \frac{V_{DA} - V_{REF}}{R_{DA}} = \frac{V_{REF} - V_O}{R_f} \qquad (7)$$

From equation (7), the output signal $V_O$ is represented by the following equation (8).

$$V_o = V_{REF} - \frac{R_f}{R_1}(V_{IN} - V_{REF}) - \frac{R_f}{R_{DA}}(V_{DA} - V_{REF}) \qquad (8)$$
$$= \left(1 + \frac{R_f}{R_1} + \frac{R_f}{R_{DA}}\right)V_{REF} - \frac{R_f}{R_1}V_{IN} - \frac{R_f}{R_1}V_{DA}$$

Assuming based on $V_{REF}$ that $V_{IN} = V_{REF} + \alpha$ and $V_{DA} = V_{REF} + \beta$, the output signal $V_O$ can be represented by the following equation (9).

$$V_o = V_{REF} - \frac{R_f}{R_1}\alpha - \frac{R_f}{R_{DA}}\beta \qquad (9)$$

Therefore, the following equation (10) represents the condition of removing the offset of the output signal $V_O$, i.e., the condition of setting the DC level of the output signal $V_O$ to the predetermined level $V_{REF}$.

$$\frac{R_f}{R_1}\alpha = -\frac{R_f}{R_{DA}}\beta \qquad (10)$$

In this equation, $(R_f/R_1)\alpha$ is the DC level of the output signal $V_O$ output from the A/D converter 15. That is, the voltage controlling unit 16 can calculate the target level of the adjustment voltage $V_{DA}$ ($=\beta+V_{REF}$) based on equation (10).

Figure 2:
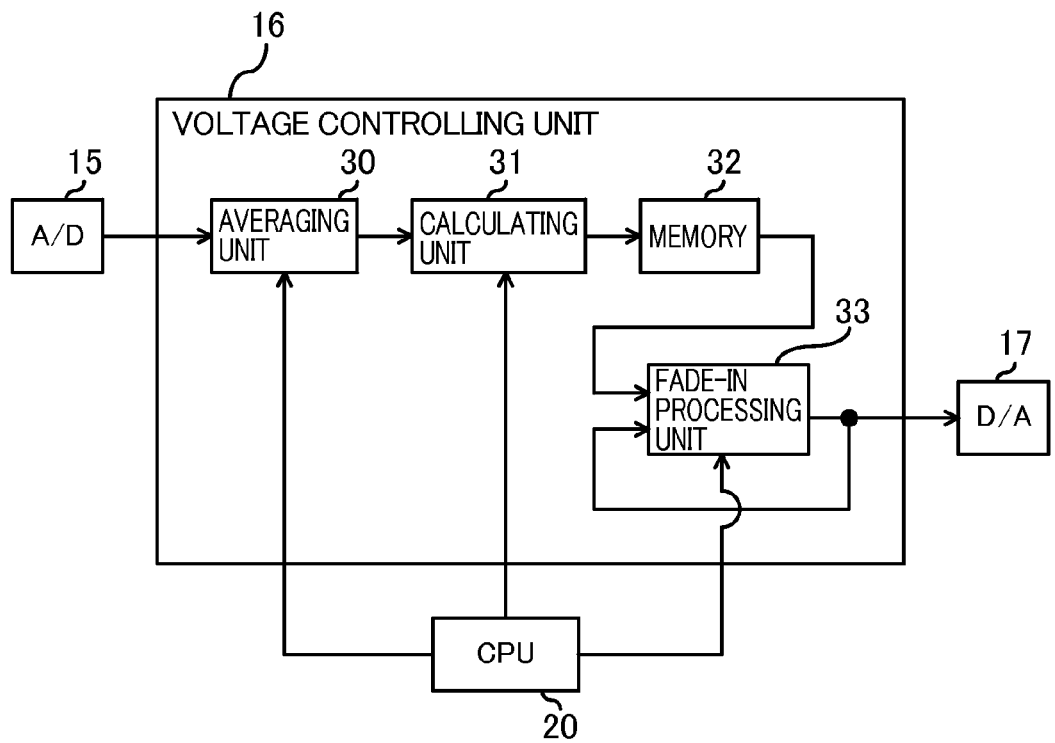
FIG. 2 is a block diagram of a configuration example of a voltage controlling unit.

FIG. 2 is a block diagram of a configuration example of the voltage controlling unit 16. The voltage controlling unit 16 includes an averaging unit 30, a calculating unit 31, a memory 32, and a fade-in processing unit 33 (adjusting unit).

The averaging unit 30 averages the digital signal output from the A/D converter 15 and indicating the DC level, and outputs the digital signal. The averaging unit can be configured, for example, with the use of a digital filter such as an FIR filter operated under the control of the CPU 20.

Based on the DC level of the output signal $V_O$ output from the averaging unit 30, the calculating unit 31 calculates the target level of the adjustment voltage $V_{DA}$ that sets the DC level of the output signal $V_O$ to the predetermined level ($V_{REF}$) and stores data indicating the target level into the memory 32.

The memory 32 is a writable storage area such as a RAM (Random Access Memory) and stores data calculated by the calculating unit 31.

The fade-in processing unit 33 step-by-step brings the control data output to the D/A converter 17 closer to the data stored in the memory 32 such that the adjustment voltage $V_{DA}$ step-by-step approaches the target level under the control of the CPU 20. The fade-in processing unit 33 can be configured with the use of a counter, for example. In this case, the fade-in processing unit 33 can count down or up a counter value output as the control data to a value indicated by the data stored in the memory 32 to step-by-step bring the adjustment voltage $V_{DA}$ closer to the target level.

The averaging unit 30, the calculating unit 31, and the fade-in processing unit 33 are not limited to hardware and can also be realized by software processes. For example, the CPU 20 or another processor (not shown) may execute programs stored in a memory (not shown) to realize the functions of the averaging unit 30, the calculating unit 31, and the fade-in processing unit 33.

The operation of the offset adjusting apparatus 1A will be described. The CPU 20 adjust the resistance value $R_f$ of the resistor 12 and changes the gain ($R_f/R_1$) for the input signal $V_{IN}$ to set the amplitude level of the output signal $V_O$ to a predetermined level. From equation (8), a change amount $\Delta V_O$ of the output signal $V_O$ corresponding to a change amount $\Delta V_{DA}$ of the adjustment voltage $V_{DA}$ is represented by the following equation (11).

$$\Delta V_o = -\frac{R_f}{R_{DA}}\Delta V_{DA} \qquad (11)$$

As can be seed from equation (11), the offset adjustment accuracy in the offset adjusting apparatus 1A is dependent on $R_f/R_{DA}$. That is, in the offset adjusting apparatus 1A, the offset adjustment accuracy can be controlled by the resistance value $R_{DA}$ of the resistor 13 regardless of the gain ($R_f/R_1$) for the input signal $V_{IN}$. Therefore, the CPU 20 adjusts the resistance value $R_{DA}$ of the resistor 13 in accordance with fluctuations of the resistance value $R_f$ such that $R_f/R_{DA}$ is set to a predetermined value. This fixes the offset adjustment accuracy in the offset adjusting apparatus 1A regardless of the gain ($R_f/R_1$) for the input signal $V_{IN}$.

The following equation (12) is derived from equation (10) representing the condition of removing the offset of the output signal $V_O$.

$$\alpha = -\frac{R_1}{R_{DA}}\beta \qquad (12)$$

Therefore, assuming that a variable range of $\beta$ ($=V_{DA}-V_{REF}$) is $-A \leq \beta \leq A$, a variable range of $\alpha$ ($=V_{IN}-V_{REF}$) is represented by the following equation (13).

$$-\frac{R_1}{R_{DA}}A \leq \alpha \leq \frac{R_1}{R_{DA}}A \qquad (13)$$

That is, the offset adjustment allowable range indicates a range of the input signal $V_{IN}$ enabling removal of the offset of the output signal $V_O$ in the offset adjusting apparatus 1A and can be controlled by the resistance value $R_{DA}$ of the resistor 13. However, the input offset adjustment allowable range is narrowed down as the resistance value $R_{DA}$ is increased. On the other hand, as shown by equation (11), the offset adjustment accuracy is improved as the resistance value $R_{DA}$ is increased. Therefore, the offset adjustment accuracy, i.e., the rate of $R_f/R_{DA}$ is determined in the offset adjusting apparatus 1A in consideration of the input offset adjustment allowable range.

Figure 3:
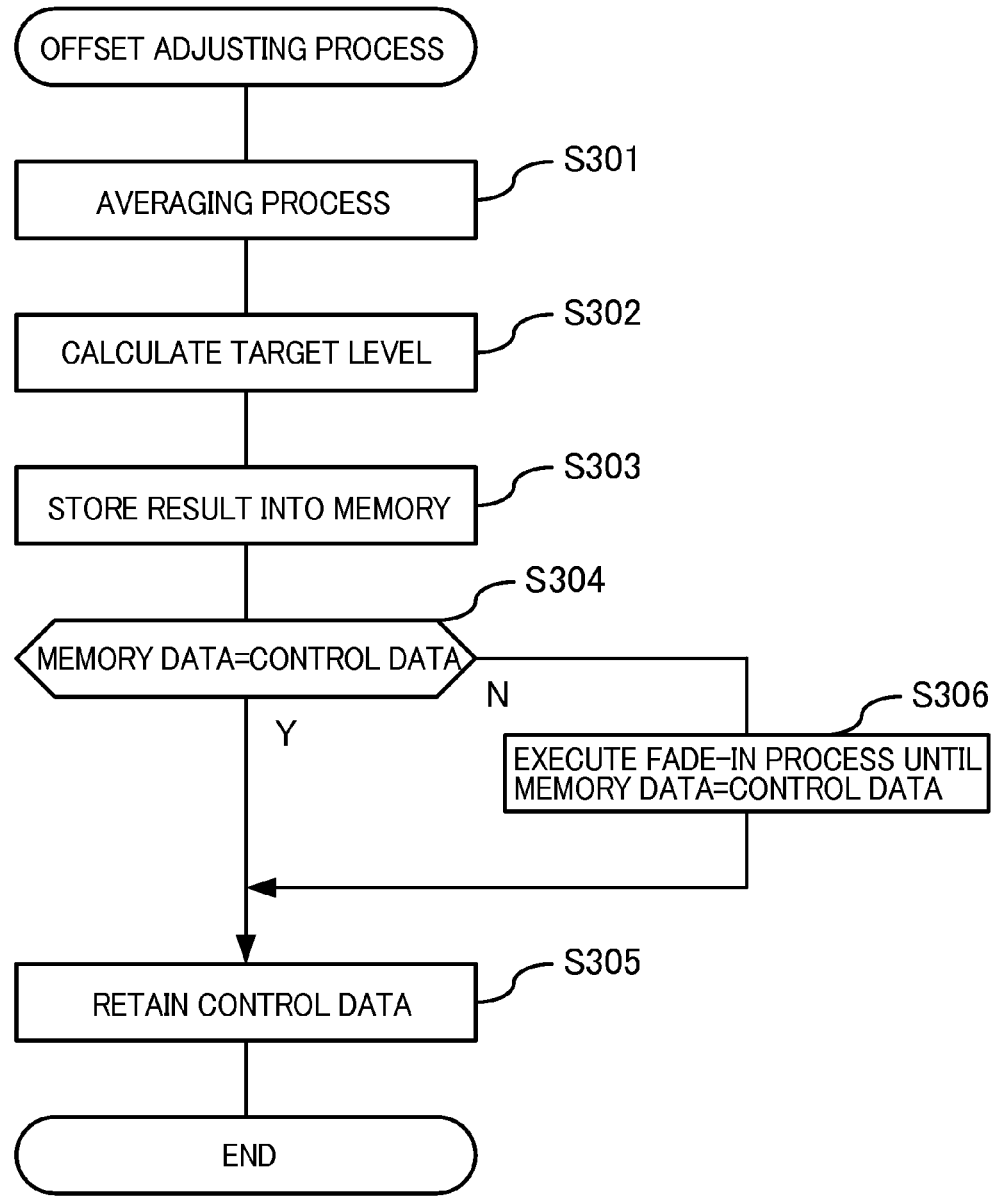
FIG. 3 is a flowchart of an example of an offset adjusting process.

When the CPU 20 adjusts the resistance value $R_f$ and the resistance value $R_{DA}$, the voltage controlling unit 16 starts an offset adjusting process. FIG. 3 is a flowchart of an example of the offset adjusting process. First, the averaging unit 30 averages the digital signal output from the A/D converter 15 and indicating the DC level of the output signal $V_O$, and outputs the digital signal (S301). Based on the averaged DC level output from the averaging unit 30, the calculating unit 31 calculates the target level of the adjustment voltage $V_{DA}$ that sets the DC level of the output signal $V_O$ to the predetermined level ($V_{REF}$) (S302) and stores data indicating the calculated target level into the memory 32 (S303).

When the data is stored in the memory 32, the fade-in processing unit 33 checks whether the control data output to the D/A converter 17 is equivalent to data (memory data) stored in the memory 32 (S304). That is, the fade-in processing unit 33 checks whether the adjustment voltage $V_{DA}$ is positioned at the target level. If the control data is equivalent to the data stored in the memory 32 (S304: Y), the fade-in processing unit 33 retains the output control data without change (S305) and terminates the process. On the other hand, if the control data is different from the data stored in the memory 32 (S304: N), the fade-in processing unit 33 step-by-step brings the control data closer to the data stored in the memory 32 until the control data becomes equivalent to the data stored in the memory 32 (S306). If the control data becomes equivalent to the data stored in the memory 32, the fade-in processing unit 33 retains the output control data (S305) and terminates the process.

Figure 4:
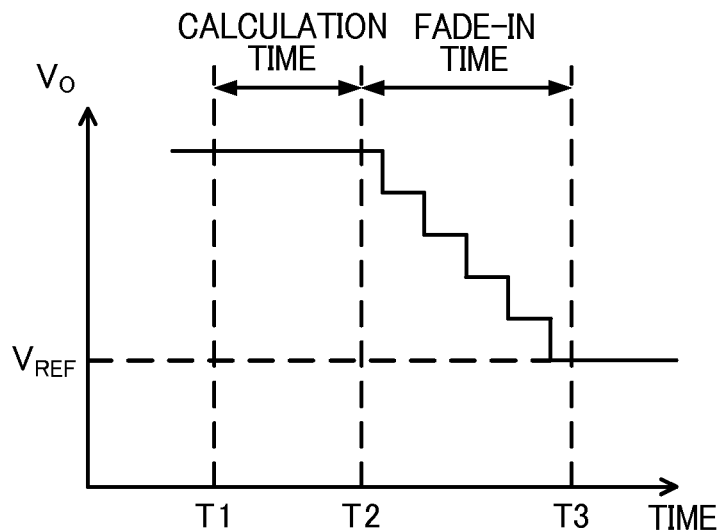
FIG. 4 is a diagram of an example of an offset adjustment sequence for the output signal $V_O$ in the offset adjusting apparatus.

FIG. 4 is a diagram of an example of an offset adjustment sequence for the output signal $V_O$ in the offset adjusting apparatus 1A. It is assumed that the calculation of the target level of the adjustment voltage $V_{DA}$ is started at time T1 by the averaging unit 30 and the calculating unit 31 of the voltage controlling unit 16. When the calculation of the target level of the adjustment voltage $V_{DA}$ is completed at time T2, the fade-in processing unit 33 step-by-step changes the adjustment voltage $V_{DA}$ toward the target level. Accordingly, the DC level of the output signal $V_O$ is also changed step-by-step. When the adjustment voltage $V_{DA}$ attains the target level at time T3, the DC level of the output signal $V_O$ becomes the predetermined level ($V_{REF}$) and the DC offset is removed from the output signal $V_O$.

In this way, the offset adjustment accuracy and the offset adjustment allowable range can be controlled in the offset adjusting apparatus 1A regardless of the gain ($R_f/R_1$) for the input signal $V_{IN}$. The offset adjustment accuracy can be fixed regardless of the gain ($R_f/R_1$) for the input signal $V_{IN}$ by controlling the rate of $R_f/R_{DA}$ to a predetermined value in conjunction with changes in the resistance value $R_f$ of the resistor 12.

The averaging unit 30 averages the DC level of the output signal $V_O$ in the voltage controlling unit 16 of the offset adjusting apparatus 1A. Therefore, variations of the DC level due to noise, etc., can be constrained in the output signal $V_O$.

The fade-in processing unit 33 step-by-step changes the adjustment voltage $V_{DA}$ to the target level in the voltage controlling unit 16 of the offset adjusting apparatus 1A. This constrains rapid changes of the DC level of the output signal $V_O$.

SECOND EMBODIMENT

Figure 5:
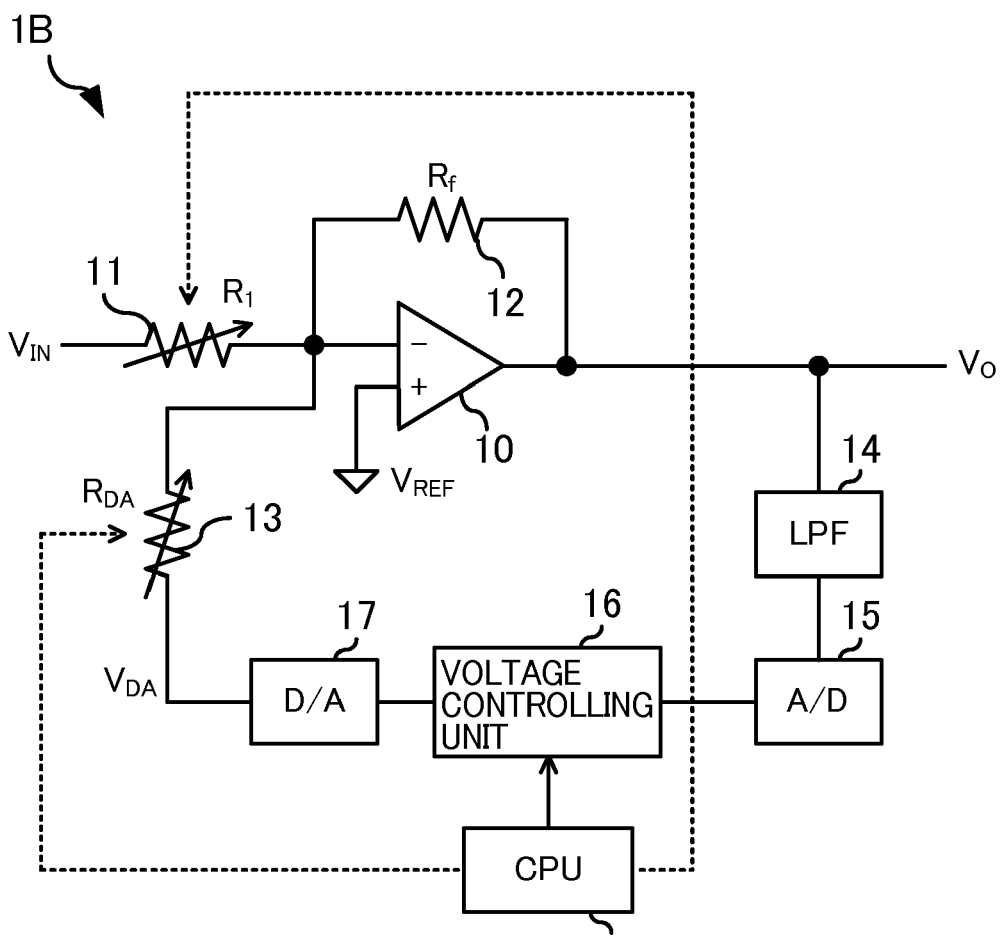
FIG. 5 is a diagram of a configuration of an offset adjusting apparatus in a second embodiment of the present invention.

FIG. 5 is a diagram of a configuration of an offset adjusting apparatus in a second embodiment of the present invention. An offset adjusting apparatus 1B has the same configuration as the offset adjusting apparatus 1A of the first embodiment except that the resistance values $R_f$ of the resistor 12 is fixed and that the resistance values $R_1$ of the resistor 11 is variable.

In the offset adjusting apparatus 1B, the CPU 20 adjusts the resistance values $R_1$ of the resistor 11 to change the gain ($R_f/R_1$) for the input signal $V_{IN}$. The change amount $\Delta V_O$ of the output signal $V_O$ corresponding to the change amount $\Delta V_{DA}$ of the adjustment voltage $V_{DA}$ in the offset adjusting apparatus 1B is as shown by equation (11). Therefore, regardless of the gain ($R_f/R_1$) for the input signal $V_{IN}$, the offset adjustment accuracy in the offset adjusting apparatus 1B is not fluctuated. In other words, the offset adjustment accuracy and the offset adjustment allowable range can be controlled in the offset adjusting apparatus 1B by adjusting the resistance values $R_{DA}$ of the resistor 13 regardless of the gain ($R_f/R_1$) for the input signal $V_{IN}$.

THIRD EMBODIMENT

Figure 6:
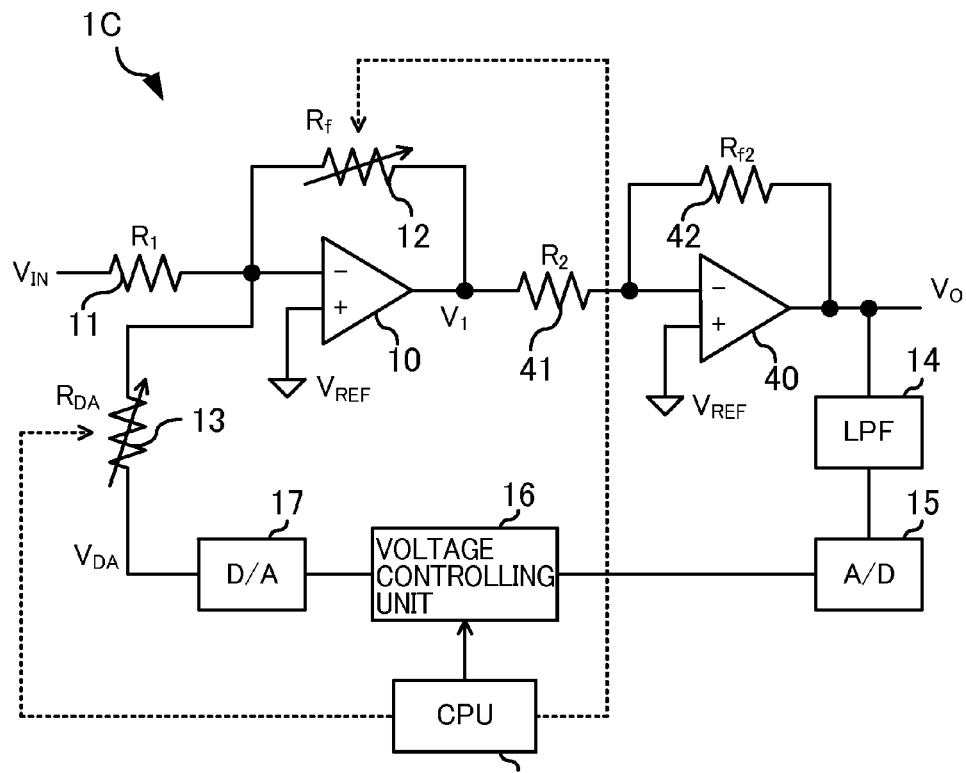
FIG. 6 is a diagram of a configuration of an offset adjusting apparatus in a third embodiment of the present invention.

FIG. 6 is a diagram of a configuration of an offset adjusting apparatus in a third embodiment of the present invention. An offset adjustment apparatus 1C includes an operational amplifier 40 and resistors 41 and 42 in addition to the constituent elements of the offset adjustment apparatus 1A of the first embodiment.

The operational amplifier 40 (amplification circuit) is a circuit for further amplifying a signal $V_1$ output from the operational amplifier 10 to output the output signal $V_O$. The predetermined reference voltage $V_{REF}$ is applied to the + input terminal of the operational amplifier 40 and the signal $V_1$ is applied to the − input terminal via the resistor 41.

The resistor 41 is connected to the output terminal of the operational amplifier 10 at one end and is connected to the − input terminal of the operational amplifier 40 at the other end. The resistor 42 is connected to the − input terminal of the operational amplifier 40 at one end and is connected to the output terminal of the operational amplifier 40 at the other end. It is assumed here that the resistance value of the resistor 41 is represented by $R_2$ and that the resistance value of the resistor 42 is represented by $R_{f2}$. The resistance values of the resistors 41 and 42 are fixed and the gain ($R_{f2}/R_2$) due to the operational amplifier 40 is also fixed.

In the offset adjustment apparatus 1C, LPF 14 outputs the DC level of the output signal $V_O$ output from the operational amplifier 40.

The signal $V_1$ output from the operation amplifier 10 in the offset adjustment apparatus 1C is represented by the following equation (14).

$$V_1 = \left(1 + \frac{R_f}{R_1} + \frac{R_f}{R_{DA}}\right) V_{REF} - \frac{R_f}{R_1} V_{IN} - \frac{R_f}{R_{DA}} V_{DA} \quad (14)$$

In the offset adjusting apparatus 1C, the relation of the following equation (15) is satisfied.

$$\frac{V_1 - V_{REF}}{R_2} = \frac{V_{REF} - V_O}{R_{f2}} \quad (15)$$

From equation (15), the signal $V_1$ can be represented by the following equation (16).

$$V_1 = \left(1 + \frac{R_2}{R_{f2}}\right) V_{REF} - \frac{R_2}{R_{f2}} V_O \quad (16)$$

Therefore, the following equation (17) is derived from equations (14) and (16).

$$\left(1 + \frac{R_2}{R_{f2}}\right) V_{REF} - \frac{R_2}{R_{f2}} V_O = \quad (17)$$
$$\left(1 + \frac{R_f}{R_1} + \frac{R_f}{R_{DA}}\right) V_{REF} - \frac{R_f}{R_1} V_{IN} - \frac{R_f}{R_{DA}} V_{DA}$$

Therefore, the output signal $V_O$ is represented by the following equation (18).

$$V_o = \left(1 + \frac{R_{f2}}{R_2}\right) V_{REF} - \frac{R_{f2}}{R_2}\left(1 + \frac{R_f}{R_1} + \frac{R_f}{R_{DA}}\right) V_{REF} + \quad (18)$$
$$\frac{R_{f2}}{R_2} \cdot \frac{R_f}{R_1} V_{IN} + \frac{R_{f2}}{R_2} \cdot \frac{R_f}{R_{DA}} V_{DA}$$
$$= \left(1 - \frac{R_{f2}}{R_2} \cdot \frac{R_f}{R_1} - \frac{R_{f2}}{R_2} \cdot \frac{R_f}{R_{DA}}\right) V_{REF} +$$
$$\frac{R_{f2}}{R_2} \cdot \frac{R_f}{R_1} V_{IN} + \frac{R_{f2}}{R_2} \cdot \frac{R_f}{R_{DA}} V_{DA}$$

Assuming based on $V_{REF}$ that $V_{IN} = V_{REF} + \alpha$ and $V_{DA} = V_{REF} + \beta$, the output signal $V_O$ can be represented by the following equation (19).

$$V_o = V_{REF} + \frac{R_{f2}}{R_2} \cdot \frac{R_f}{R_1} \alpha - \frac{R_{f2}}{R_2} \cdot \frac{R_f}{R_{DA}} \beta \quad (19)$$

Therefore, the following equation (20) represents the condition of removing the offset of the output signal $V_O$, i.e., the condition of setting the DC level of the output signal $V_O$ to the predetermined level $V_{REF}$.

$$\frac{R_{f2}}{R_2} \cdot \frac{R_f}{R_1} \alpha = -\frac{R_{f2}}{R_2} \cdot \frac{R_f}{R_{DA}} \beta \quad (20)$$

In this equation, $(R_{f2}/R_2) \cdot (R_f/R_1)\alpha$ is the DC level of the output signal $V_O$ output from the A/D converter 15. That is, the voltage controlling unit 16 can calculate the target level of the adjustment voltage $V_{DA}$ ($=\beta + V_{REF}$) based on equation (20).

From equation (18), the change amount $\Delta V_O$ of the output signal $V_O$ corresponding to the change amount $\Delta V_{DA}$ of the adjustment voltage $V_{DA}$ is represented by the following equation (21).

$$\Delta V_o = \frac{R_{f2}}{R_2} \cdot \frac{R_f}{R_{DA}} \Delta V_{DA} \quad (21)$$

Since the gain ($R_{f2}/R_2$) is fixed, it can be seen from equation (21) that the offset adjustment accuracy in the offset adjusting apparatus 1C is dependent on $R_f/R_{DA}$. That is, in the offset adjusting apparatus 1C, the offset adjustment accuracy can be controlled by the resistance value $R_{DA}$ of the resistor 13 regardless of the gain ($R_f/R_1$) for the input signal $V_{IN}$. Therefore, the CPU 20 adjusts the resistance value $R_{DA}$ of the resistor 13 in accordance with fluctuations of the resistance value $R_f$ such that $R_f/R_{DA}$ is set to a predetermined value. This fixes the offset adjustment accuracy in the offset adjusting apparatus 1C regardless of the gain ($R_f/R_1$) for the input signal $V_{IN}$.

The following equation (22) is derived from equation (20) representing the condition of removing the offset of the output signal $V_O$.

$$\alpha = -\frac{R_1}{R_{DA}} \beta \quad (22)$$

Therefore, assuming that a variable range of $\beta$ ($=V_{DA}-V_{REF}$) is $-A \leq \beta \leq A$, a variable range of $\alpha$ ($=V_{IN}-V_{REF}$) is represented by the following equation (23).

$$-\frac{R_1}{R_{DA}} A \leq \alpha \leq \frac{R_1}{R_{DA}} A \quad (23)$$

That is, the offset adjustment allowable range indicates a range of the input signal $V_{IN}$ enabling removal of the offset of the output signal $V_O$ in the offset adjusting apparatus 1C and can be controlled by the resistance value $R_{DA}$ of the resistor 13. However, the input offset adjustment allowable range is narrowed down as the resistance value $R_{DA}$ is increased. On the other hand, as shown by equation (21), the offset adjustment accuracy is improved as the resistance value $R_{DA}$ is increased. Therefore, the offset adjustment accuracy, i.e., the rate of $R_f/R_{DA}$ is determined in consideration of the input offset adjustment allowable range.

In this way, the offset adjustment accuracy and the offset adjustment allowable range can be controlled in the offset adjusting apparatus 1C regardless of the gain ($R_f/R_1$) for the input signal $V_{IN}$ as is the case with the offset adjusting apparatus 1A. The offset adjustment accuracy can be fixed regardless of the gain ($R_f/R_1$) for the input signal $V_{IN}$ by controlling the rate of $R_f/R_{DA}$ to a predetermined value in conjunction with changes in the resistance value $R_f$ of the resistor 12.

APPLICATION EXAMPLE

Figure 7:
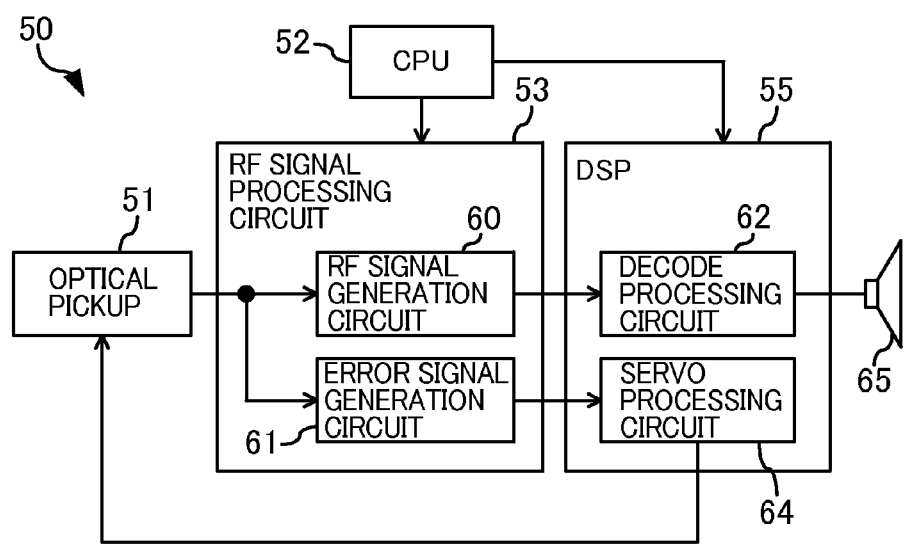
FIG. 7 is a block diagram of a configuration example of an optical apparatus.

An application example of the offset adjusting apparatus of the present embodiments will be described. FIG. 7 is a block diagram of a configuration example of an optical disk apparatus. An optical disk apparatus 50 includes an optical pickup 51, a CPU 52, an RF signal processing circuit 53, and a DSP (Digital Signal Processor) 55. The RF signal processing circuit 53 includes an RF signal generating circuit 60 and an error signal generating circuit 61, and the DSP 55 includes a decode processing circuit 62 and a servo processing circuit 64.

The optical pickup 51 outputs a signal acquired by applying a beam to an optical disk such as CD and DVD. The RF signal processing circuit 53 generates and outputs an RF (Radio Frequency) signal for reproducing sound, etc., as well as an FE (Focusing Error) signal and a TE (Tracking Error) signal used in a servo process, based on the signal output from the optical pickup. The decode processing circuit 62 of the DSP 55 performs a demodulation process, an acoustic process, etc., for the RF signal output from the RF signal generating circuit 60 of the RF signal processing circuit 53 and outputs the signal. The signal output from the decode processing circuit 62 is finally output from a speaker as sound. The servo processing circuit 64 of the DSP 55 performs control such as focusing servo and tracking servo based on the FE signal and the TE signal output from the error signal generating circuit 61 of the RF signal processing circuit 53.

Figure 8:
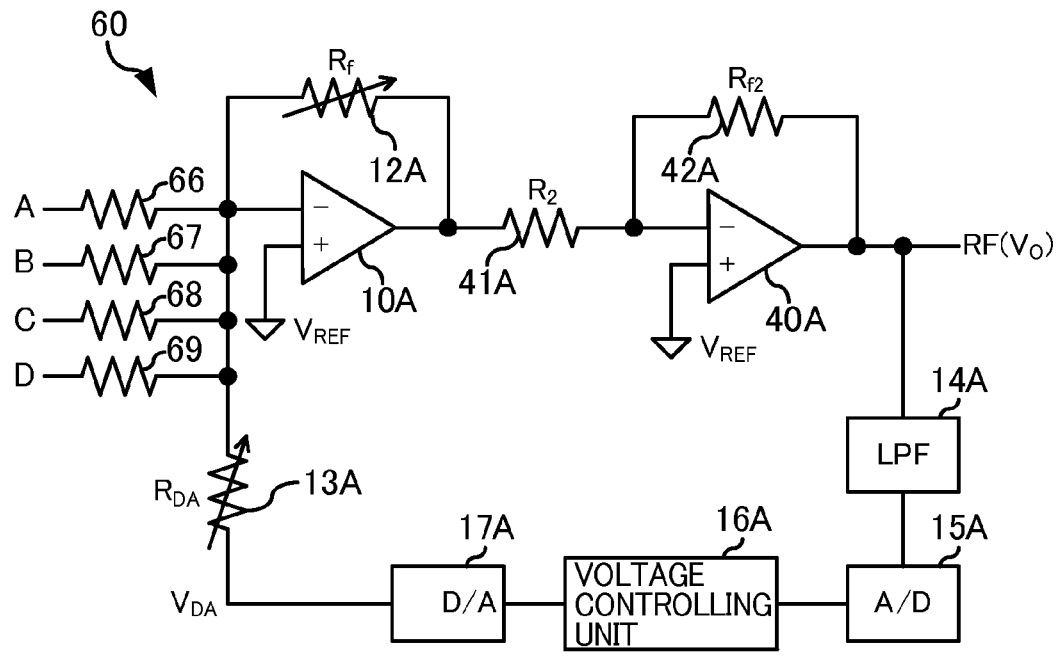
FIG. 8 is a diagram of a configuration example of an RF signal generation circuit.

The offset adjusting apparatus of the present embodiments are applicable to the RF signal generating circuit 60 and the error signal generating circuit 61 of this optical disk apparatus 50. FIG. 8 is a diagram of a configuration example of the RF signal generating circuit 60. The RF signal generating circuit 60 includes operational amplifiers 10A, 40A, resistors 66 to 69, 12A, 13A, 41A, and 42A, an LPF 14A, an A/D converter 15A, a voltage controlling unit 16A, and a D/A converter 17A.

The offset adjusting apparatus 1C of the third embodiment is applied to this RF signal generating circuit 60. That is, the operational amplifiers 10A, 40A correspond to the operational amplifiers 10, 40 of the offset adjusting apparatus 1C, and the LPF 14A, the A/D converter 15A, the voltage controlling unit 16A, and the D/A converter 17A correspond to the LPF 14, the A/D converter 15, the voltage controlling unit 16, and the D/A converter 17 of the offset adjusting apparatus 1C, respectively. The resistors 66 to 69 correspond to the resistor 11 of the offset adjusting apparatus 1C, and the resistors 12A, 13A, 41A, and 42A correspond to 12, 13, 41, and 42 of the offset adjusting apparatus 1C, respectively.

A signal A output from the optical pickup 51 is input to one end of the resistor 66; a signal B output from the optical pickup 51 is input to one end of the resistor 67; a signal C output from the optical pickup 51 is input to one end of the resistor 68; and a signal D output from the optical pickup 51 is input to one end of the resistor 69. The output signal $V_O$ acquired by adding/amplifying the signals A to D is the RF signal.

In this RF signal generating circuit 60, as shown in the third embodiment, the offset adjustment accuracy and the offset adjustment allowable range can be controlled by the resistance value $R_{DA}$ of the resistor 13A regardless of the gain of the operational amplifier 10A. The offset adjustment accuracy can be fixed regardless of the AC gain by controlling the rate of $R_f/R_{DA}$ to a predetermined value in conjunction with changes in the resistance value $R_f$ of the resistor 12A.

Figure 9:
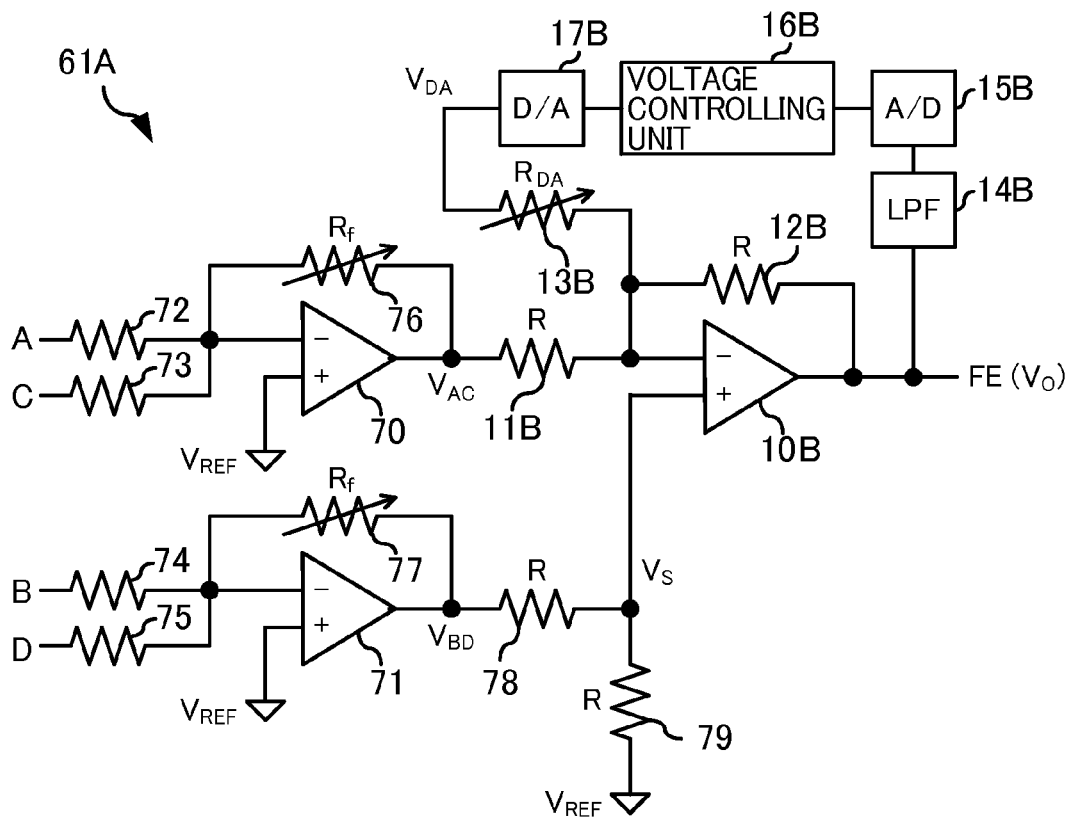
FIG. 9 is a diagram of a configuration example of an FE signal generation circuit that is one of an error signal generation circuits.

FIG. 9 is a diagram of a configuration example of an FE signal generation circuit that is one of the error signal generation circuit 61. An FE signal generation circuit 61A includes an operational amplifier 10B, resistors 11B to 13B, an LPF 14B, an A/D converter 15B, a voltage controlling unit 16B, and a D/A converter 17B. The FE signal generation circuit 61A further includes operational amplifiers 70, 71, and resistors 72 to 79. The offset adjusting apparatus 1A of the first embodiment is applied to this FE signal generating circuit 61A. The operational amplifier 10B corresponds to the operational amplifier 10 of the offset adjusting apparatus 1A, and the resistors 11B to 13B, the LPF 14B, the A/D converter 15B, the voltage controlling unit 16B, and the D/A converter 17B correspond to the resistors 11 to 13, the LPF 14, the A/D converter 15, the voltage controlling unit 16, and the D/A converter 17 of the offset adjusting apparatus 1A, respectively.

The operational amplifier 70 is a circuit for outputting a signal $V_{AC}$ acquired by adding/amplifying the signals A and C output from the optical pickup 51. The predetermined reference voltage $V_{REF}$ is applied to the + input terminal of the operational amplifier 70, and the input signals A and C are input to the − input terminal via the resistors 72 and 73, respectively.

The resistor 72 receives input of the signal A output from the optical pickup 51 through one end and the other end is connected to the − input terminal of the operational amplifier 70. The resistor 73 receives input of the signal B output from the optical pickup 51 through one end and the other end is connected to the − input terminal of the operational amplifier 70. The resistor 76 is connected at one end to the − input terminal of the operational amplifier 70 and is connected at the other end to the output terminal of the operational amplifier 70. The resistor 76 is a variable resistor and the resistance value $R_f$ of the resistor 76 is adjusted under the control of the CPU 52 such that the amplitude level of the signal $V_{AC}$ is set to a predetermined level.

The operational amplifier 71 is a circuit for outputting a signal $V_{BD}$ acquired by adding/amplifying the signals B and D output from the optical pickup 51. The predetermined reference voltage $V_{REF}$ is applied to the + input terminal of the operational amplifier 71, and the input signals B and D are input to the − input terminal via the resistors 74 and 75, respectively.

The resistor 74 receives input of the signal B output from the optical pickup 51 through one end and the other end is connected to the − input terminal of the operational amplifier 71. The resistor 75 receives input of the signal D output from the optical pickup 51 through one end and the other end is connected to the − input terminal of the operational amplifier 71. The resistor 77 is connected at one end to the − input terminal of the operational amplifier 71 and is connected at the other end to the output terminal of the operational amplifier 71. The resistor 77 is a variable resistor and the resistance value $R_f$ of the resistor 77 is adjusted under the control of the CPU 52 such that the amplitude level of the signal $V_{BD}$ is set to a predetermined level.

The signal $V_{AC}$ output from the operational amplifier 70 is applied to the − input terminal of the operational amplifier 10B via the resistor 11B and the signal $V_{BD}$ output from the operational amplifier 71 is applied to the + input terminal of the operational amplifier 10B via the resistor 78.

The resistor 78 is connected at one end to the output terminal of the operational amplifier 71 and is connected at the other end to the + input terminal of the operational amplifier 10B. One end of the resistor 79 is applied with the predetermined reference voltage $V_{REF}$, and the other end is connected to the − input terminal of the operational amplifier 10B. The resistance values of the resistors 11B, 12B, 78, and 79 are all the same, and the operational amplifier 10B configures a subtraction circuit. That is, the output signal $V_O$ output from the operational amplifier 10B is the FE signal acquired by amplifying (A+C)−(B+D).

Assuming that the resistance values of the resistors 11B, 12B, 78, and 79 are R and that the voltage applied to the + input terminal of the operational amplifier 10B is $V_S$ (reference voltage), the relation of the following equation (24) is satisfied in the FE signal generation circuit 61A.

$$\frac{V_{AC} - V_S}{R} + \frac{V_{DA} - V_S}{R_{DA}} = \frac{V_S - V_O}{R} \quad (24)$$

From equation (24), the output signal $V_O$ is represented by the following equation (25).

$$V_o = 2V_S - V_{AC} - \frac{R}{R_{DA}}(V_{DA} - V_S) \quad (25)$$

The relation of the following equation (26) is also satisfied in the FE signal generation circuit 61A.

$$\frac{V_{BD} - V_S}{R} = \frac{V_S - V_{REF}}{R} \quad (26)$$

$V_S = (\frac{1}{2})(V_{BD} + V_{REF})$ is derived from equation (26), and this is substituted for equation (25) to represent the output signal $V_O$ as the following equation (27).

$$V_o = V_{BD} + V_{RFE} - V_{AC} - \frac{R}{R_{DA}}\left(V_{DA} - \frac{1}{2}V_{BD} - \frac{1}{2}V_{REF}\right) \quad (27)$$

$$= \left(1 + \frac{R}{2R_{DA}}\right)V_{BD} - V_{AC} - \frac{R}{R_{DA}}V_{DA} + \left(1 + \frac{R}{2R_{DA}}\right)V_{REF}$$

Therefore, assuming that $V_{AC} = V_{REF} + \alpha$, $V_{BD} = V_{REF} + \beta$ and $V_{DA} = V_{REF} + \gamma$, the following equation (28) represents the condition of removing the offset of the output signal $V_O$, i.e., the condition of setting the DC level of the output signal $V_O$ to the predetermined level $V_{REF}$.

$$\frac{R}{R_{DA}}\gamma = \left(1 + \frac{R}{2R_{DA}}\right)\alpha - \beta \quad (28)$$

Therefore, the voltage controlling unit 16B can calculate the target level of the adjustment voltage $V_{DA}$ for removing the offset of the output voltage $V_O$ (the output voltage $V_O = V_{REF}$) based on equation (28).

From equation (27), the change amount $\Delta V_O$ of the output signal $V_O$ corresponding to the change amount $\Delta V_{DA}$ of the adjustment voltage $V_{DA}$ is represented by the following equation (29).

$$\Delta V_o = -\frac{R}{R_{DA}}\Delta V_{DA} \quad (29)$$

As can be seen from equation (29), the offset adjustment accuracy in the FE signal generation circuit 61A is dependent on $R/R_{DA}$. That is, in the FE signal generation circuit 61A, the offset adjustment accuracy can be controlled by the resistance value $R_{DA}$ of the resistor 13B. Since the resistance value R is fixed, the offset adjustment accuracy can be fixed by fixing the resistance value $R_{DA}$ of the resistor 13B. The offset adjustment allowable range can also be controlled by the resistance value $R_{DA}$ of the resistor 13B.

Figure 10:
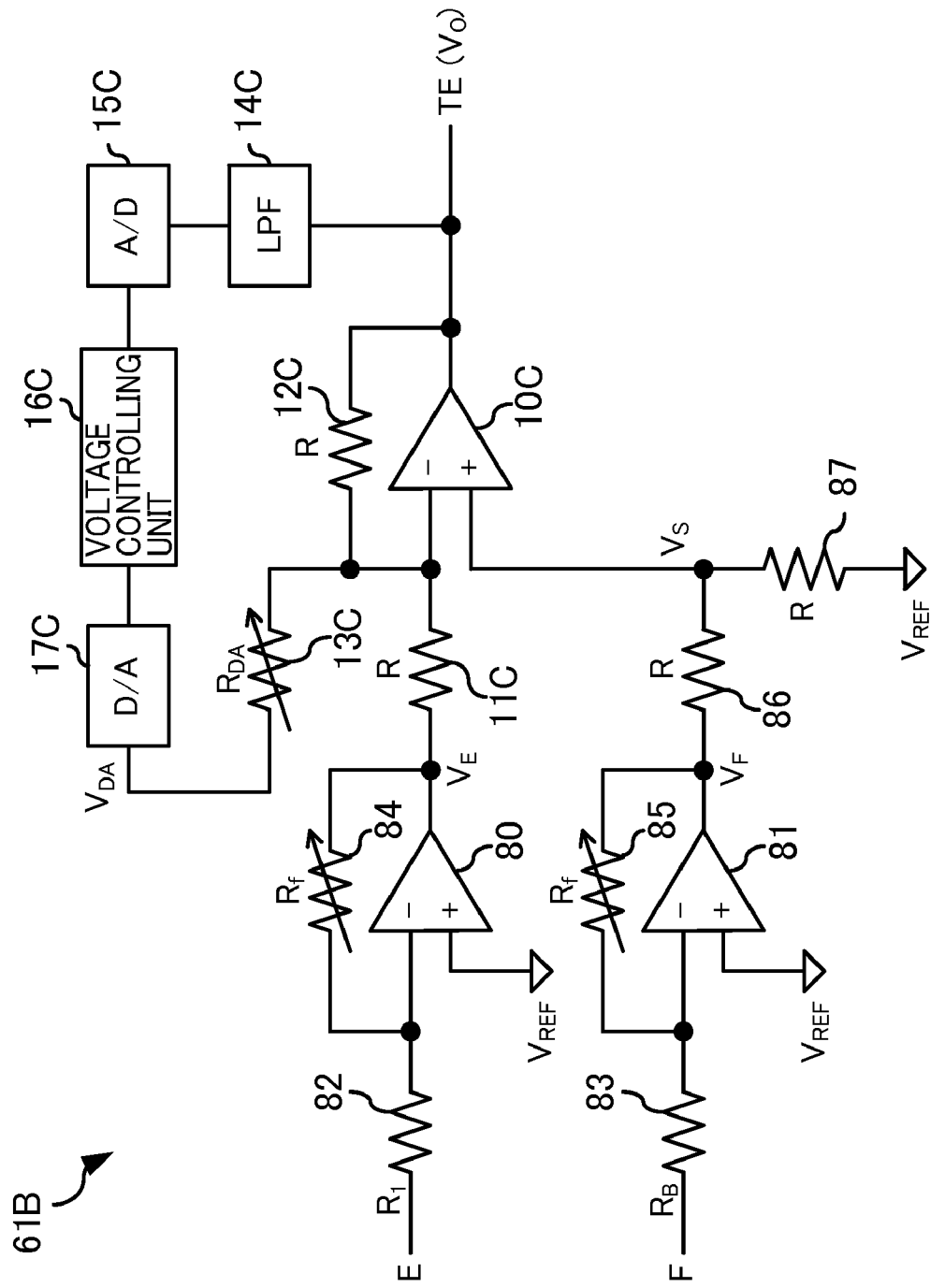
FIG. 10 is a diagram of a configuration example of a TE signal generation circuit that is one of the error signal generation circuit.

FIG. 10 is a diagram of a configuration example of a TE signal generation circuit that is one of the error signal generation circuit 61. A TE signal generation circuit 61B includes an operational amplifier 10C, resistors 11C to 13C, an LPF 14C, an A/D converter 15C, a voltage controlling unit 16C, and a D/A converter 17C. The TE signal generation circuit 61B further includes operational amplifiers 80, 81, and resistors 82 to 87. The TE signal generation circuit 61B has the same configuration as the FE signal generation circuit 61A.

The operational amplifier 80 is a circuit for outputting a signal $V_E$ acquired by amplifying a signal E output from the optical pickup 51. The predetermined reference voltage $V_{REF}$ is applied to the + input terminal of the operational amplifier 80, and the input signal E is input to the − input terminal via the resistor 82.

The resistor 82 receives input of the signal E output from the optical pickup 51 through one end and the other end is connected to the − input terminal of the operational amplifier 80. The resistor 84 is connected at one end to the − input terminal of the operational amplifier 80 and is connected at the other end to the output terminal of the operational amplifier 80. The resistor 84 is a variable resistor and the resistance value $R_f$ of the resistor 84 is adjusted under the control of the CPU 52 such that the amplitude level of the signal $V_E$ is set to a predetermined level.

The operational amplifier 81 is a circuit for outputting a signal $V_F$ acquired by amplifying a signal F output from the optical pickup 51. The predetermined reference voltage $V_{REF}$ is applied to the + input terminal of the operational amplifier 81, and the input signal F is input to the − input terminal via the resistor 83.

The resistor 83 receives input of the signal F output from the optical pickup 51 through one end and the other end is connected to the − input terminal of the operational amplifier 81. The resistor 85 is connected at one end to the − input terminal of the operational amplifier 81 and is connected at the other end to the output terminal of the operational amplifier 81. The resistor 85 is a variable resistor and the resistance value $R_f$ of the resistor 85 is adjusted under the control of the CPU 52 such that the amplitude level of the signal $V_F$ is set to a predetermined level.

The signal $V_E$ output from the operational amplifier 80 is applied to the − input terminal of the operational amplifier 10C via the resistor 11C and the signal $V_F$ output from the operational amplifier 81 is applied to the + input terminal of the operational amplifier 10C via the resistor 86.

The resistor 86 is connected at one end to the output terminal of the operational amplifier 81 and is connected at the other end to the + input terminal of the operational amplifier 10C. One end of the resistor 87 is applied with the predetermined reference voltage $V_{REF}$, and the other end is connected to the + input terminal of the operational amplifier 10C. The resistance values of the resistors 11C, 12C, 86, and 87 are all the same, and the operational amplifier 10C is a subtraction circuit. That is, the output signal $V_O$ output from the operational amplifier 10C is the TE signal acquired by amplifying E-F.

In this TE signal generation circuit 61B, $V_{AC}$ in the FE signal generation circuit 61A is $V_E$, and $V_{BD}$ in the FE signal generation circuit 61A is $V_F$. Therefore, it can be said that the offset adjustment accuracy in the TE signal generation circuit 61B is also dependent on $R/R_{DA}$. That is, in the TE signal generation circuit 61B, the offset adjustment accuracy can be controlled by the resistance value $R_{DA}$ of the resistor 13C. Since the resistance value R of the resistor 12C is fixed, the offset adjustment accuracy can be fixed by fixing the resistance value $R_{DA}$ of the resistor 13C. The offset adjustment allowable range can also be controlled by the resistance value $R_{DA}$ of the resistor 13C.

Automatic Control

Figure 11:
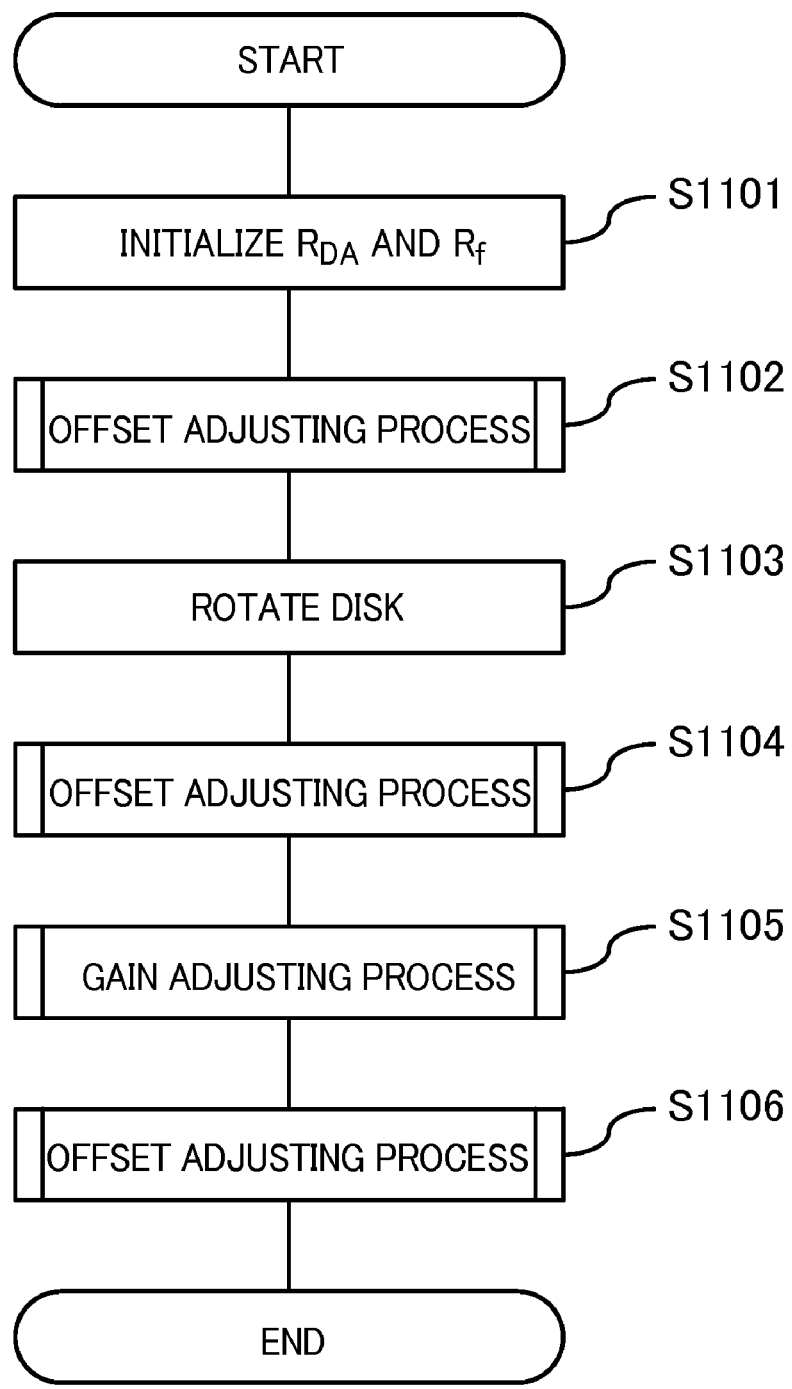
FIG. 11 is a flowchart of an overall flow of the offset adjusting process and gain adjusting process in the optical disk apparatus.

Processes of offset adjustment and gain adjustment of the RF signal generating circuit 60 in the optical disk apparatus 50 will be described. FIG. 11 is a flowchart of an overall flow of the offset adjusting process and gain adjusting process in the optical disk apparatus 50. First, the CPU 52 adjusts the resistance value $R_f$ of the resistor 12A and the resistance value $R_{DA}$ of the resistor 13A in the RF signal generating circuit 60 to default values (S1101). The CPU 52 controls the voltage controlling unit 16A to execute the offset adjusting process of adjusting the offset (offset within the circuit) of the output signal $V_O$ (RF signal) (S1102). After the offset adjusting process is executed, the optical disk apparatus 50 rotates an optical disk and the optical pickup 51 outputs a signal (S1103). Since the signal from the optical pickup 51 includes the DC offset, the CPU 52 executes the offset adjusting process again (S1104). The CPU 52 then executes the gain adjusting process to set the amplitude level of the output signal $V_O$ to a predetermined level (S1105). The CPU 52 further executes the offset adjusting process for the DC offset generated due to the change in the gain (S1106).

Figure 12:
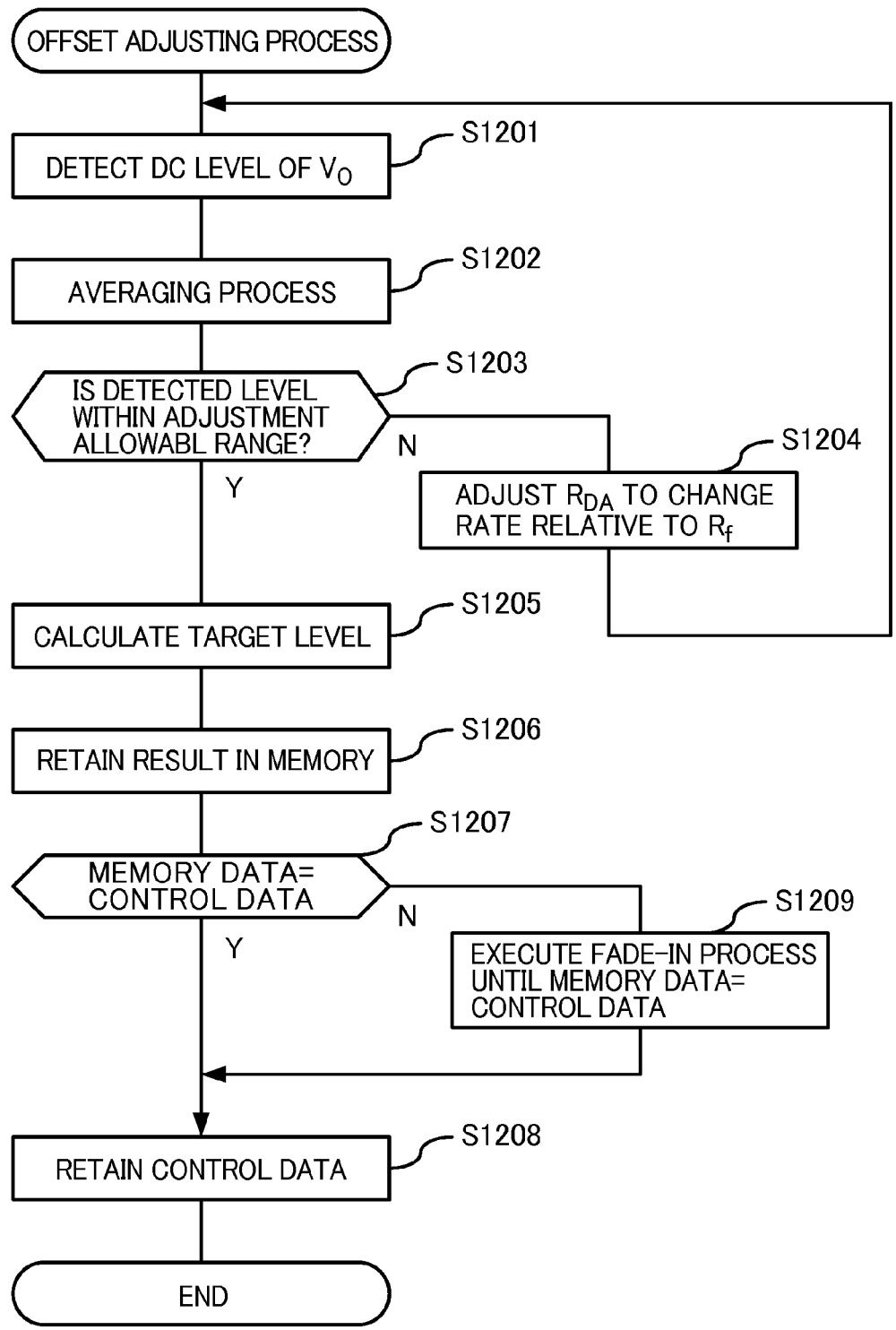
FIG. 12 is a flowchart of details of the offset adjusting process.

FIG. 12 is a flowchart of details of the offset adjusting process (S1102, S1104, and S1106). First, the CPU 52 detects the DC level of the output signal $V_O$ with the digital signal output from the A/D converter 15A (S1201). The averaging unit 30 averages the digital signal output from the A/D converter 15 and indicating the DC level of the output signal $V_O$, and outputs the digital signal (S1202). The CPU 52 checks whether the averaged DC level is within the offset adjustment allowable range (S1203). If the DC level is not within the offset adjustment allowable range (S1203: N), the CPU 52 adjusts the resistance value $R_{DA}$ of the resistor 13A to change the rate thereof relative to the resistance value $R_f$ of the resistor 12A such that the DC level becomes within the offset adjustment allowable range (S1204). That is, if the DC level is not within the offset adjustment allowable range, the resistance value $R_{DA}$ is reduced to expand the offset adjustment allowable range. Subsequent processes (S1205 to S1209) are the same as the above processes (S302 to S306) and the offset of the output signal $V_O$ is removed.

Figure 13:
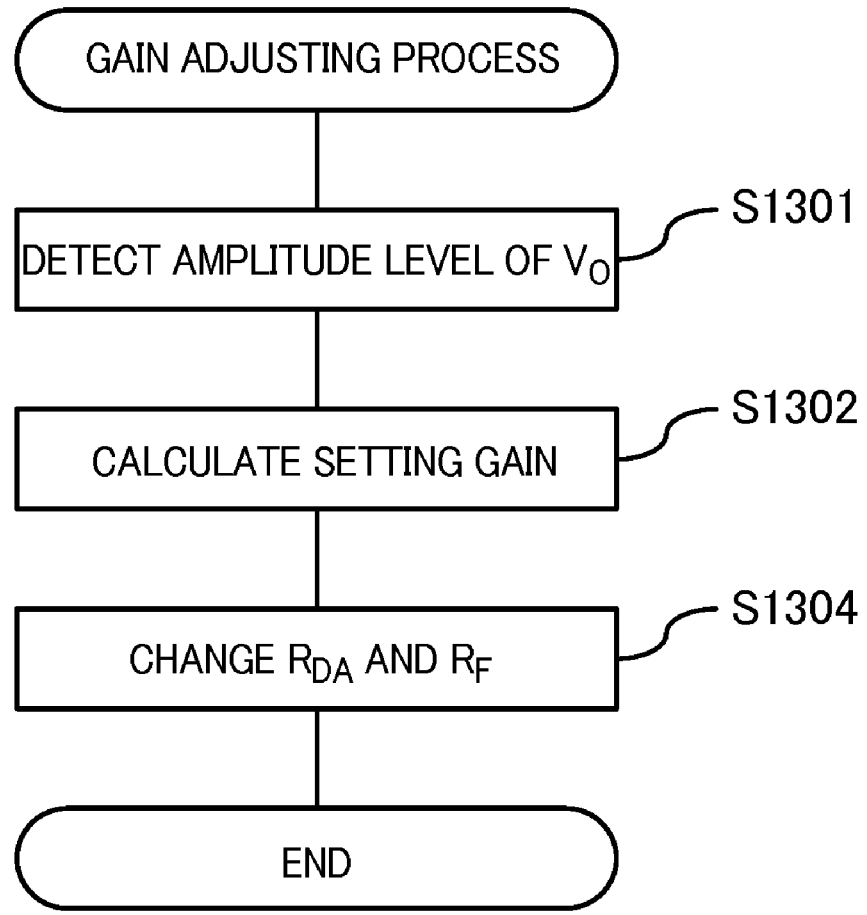
FIG. 13 is a flowchart of details of the gain adjusting process.
Figure 14:
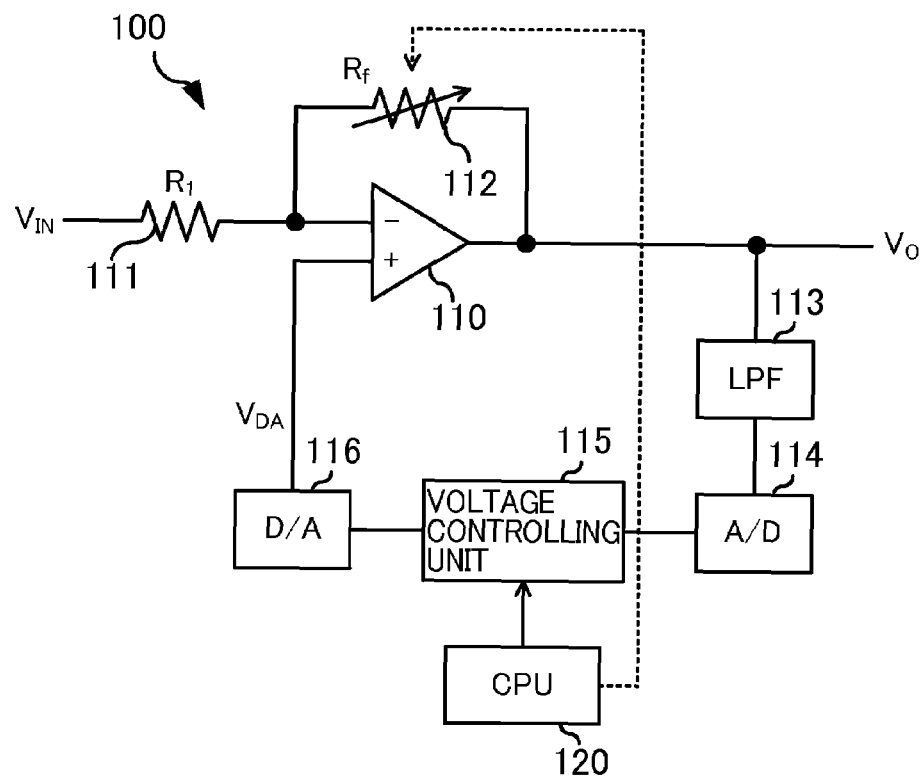
FIG. 14 is a diagram of a configuration of an offset adjusting apparatus equivalent to a circuit disclosed in patent document 1.
Figure 15:
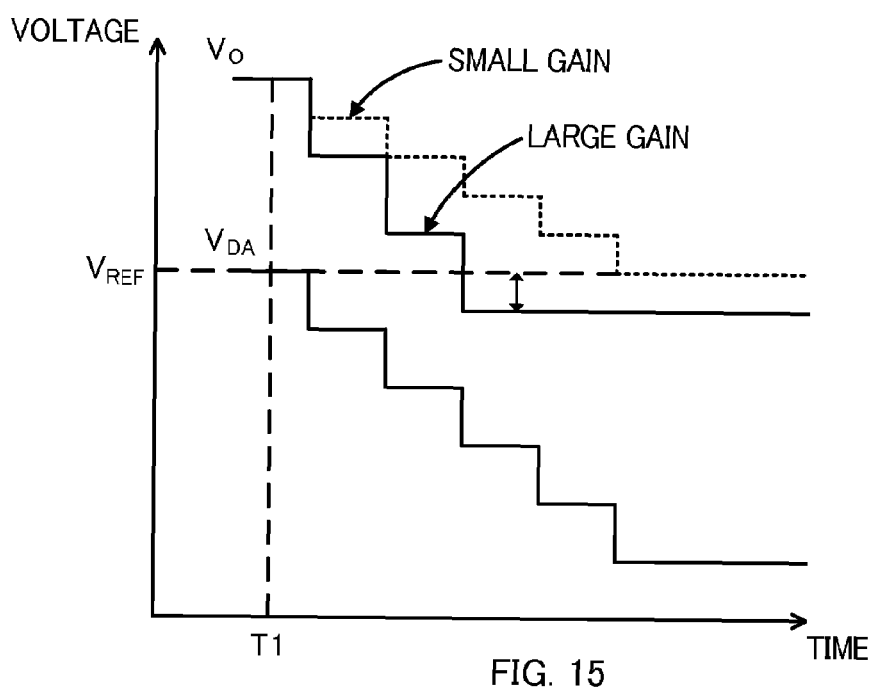
FIG. 15 is an example of an example of an offset adjustment sequence for the output signal $V_O$ in accordance with the gain of the offset adjusting apparatus.

FIG. 13 is a flowchart of details of the gain adjusting process (S1105). First, the CPU 52 detects the amplitude level of the output signal $V_O$ (S1301). Based on the detected amplitude level of the output signal $V_O$, the CPU 52 calculates a gain for setting the amplitude level of the output signal $V_O$ to a predetermined level (S1302). The CPU 52 changes the resistance value $R_f$ of the resistor 12A to achieve the calculated gain and changes the resistance value $R_{DA}$ of the resistor 13A in conjunction with the change in the resistance value $R_f$ (S1304). That is, the resistance value $R_{DA}$ is changed to set the rate of $R_f/R_{DA}$ to the rate determined in the offset adjusting process such that the offset adjusting accuracy is not changed due to the change in the gain.

The DC offset of the output signal $V_O$ can adequately be removed by adjusting the offset adjustment allowable range in this offset adjusting process. The offset adjustment accuracy determined in the offset adjusting process is maintained regardless of the change in the gain by changing the resistance value $R_{DA}$ of the resistor 13A in conjunction with the resistance value $R_f$ of the resistor 12A in the gain adjusting process.

The embodiments of the present invention have been described. As described above, the offset adjustment accuracy and the offset adjustment allowable range can be controlled regardless of the gain by adjusting the resistance value $R_{DA}$ of the resistor having the adjustment voltage $V_{DA}$ applied thereto.

As shown in the offset adjustment apparatus 1C, the offset adjustment can be performed, including the offset due to the amplification circuit (operational amplifier 40).

Variations of the DC level due to noise, etc., can be constrained in the output signal $V_O$ by averaging the DC level of the output signal $V_O$ with the averaging unit 30.

Rapid changes of the DC level can be constrained in the output signal $V_O$ by step-by-step changing the adjustment voltage $V_{DA}$ to the target level with the fade-in processing unit 33.

The offset adjustment accuracy can be maintained regardless of the change in the gain by changing the resistance value $R_{DA}$ in conjunction with the resistance value $R_f$ in the gain adjusting process.

The DC offset of the output signal $V_O$ can adequately be removed by adjusting the resistance value $R_{DA}$ in accordance with the DC level of the output signal $V_O$ in the offset adjusting process.

The above embodiments of the present invention are simply for facilitating the understanding of the present invention and are not in any way to be construed as limiting the present invention. The present invention may variously be changed or altered without departing from its spirit and encompass equivalents thereof.

It is claimed:

1. An offset adjusting apparatus for adjusting an offset of an output signal output from an amplifier including an operational amplifier and an amplification circuit, the operational amplifier having a first input terminal to which an input signal is to be input via a first resistor, a second input terminal to which a reference voltage is to be applied, and an output terminal, a second resistor being connected between the first input terminal and the output terminal, a resistance value of the second resistor being controllable, the amplification circuit connected to the output terminal of the operational amplifier to provide an amplified output signal, the offset adjusting apparatus comprising:

an adjustment resistor having a controllable resistance value, the adjustment resistor having a first end to which an adjustment voltage for adjusting the offset is to be applied and a second end connected to the first input terminal of the operational amplifier;

a controlling unit configured to control the adjustment voltage applied to the adjustment resistor, to remove the offset of the amplified output signal output from the amplification circuit; and a gain adjusting unit configured to control the resistance value of the second resistor to set an amplitude level of the output signal to a predetermined level, and to control the resistance value of the adjustment resistor to set a ratio of the resistance value of the second resistor to the resistance value of the adjustment resistor at a predetermined value, based on the amplitude level of the output signal.

2. The offset adjusting apparatus of claim 1, wherein the controlling unit further includes:

a calculating unit connected to the amplifier circuit, the calculating unit configured to calculate a target level of the adjustment voltage enabling removal of the offset of the output signal based on the DC level of the output signal; and an adjusting unit connected to the calculating unit, the adjusting unit configured to adjust the adjustment voltage applied to the adjustment resistor to the target level calculated by the calculating unit.

3. The offset adjusting apparatus of claim 2, wherein
the controlling unit further includes an averaging unit configured to average the DC level of the output signal to be output, and wherein
the calculating unit is configured to calculate the target level of the adjustment voltage enabling removal of the offset of the output signal based on the averaged DC level of the output signal output from the averaging unit.

4. The offset adjusting apparatus of claim 2, wherein
the adjusting unit is configured to change step-by-step the adjustment voltage applied to the adjustment resistor to the target level calculated by the calculating unit.

5. The offset adjusting apparatus of claim 3, wherein
the adjusting unit is configured to change step-by-step the adjustment voltage applied to the adjustment resistor to the target level calculated by the calculating unit.

6. The offset adjusting apparatus of claim 1, further comprising:
an adjustment range controlling unit configured to control the resistance value of the adjustment resistor based on the DC level of the output signal to remove the offset of the amplified output signal.

7. The offset adjusting apparatus of claim 2, further comprising:
an adjustment range controlling unit configured to control the resistance value of the adjustment resistor based on the DC level of the output signal to remove the offset of the output signal.

8. The offset adjusting apparatus of claim 3, further comprising:
an adjustment range controlling unit configured to control the resistance value of the adjustment resistor based on the DC level of the output signal to remove the offset of the output signal.

9. The offset adjusting apparatus of claim 4, further comprising:
an adjustment range controlling unit configured to control the resistance value of the adjustment resistor based on the DC level of the output signal to remove the offset of the output signal.

10. An offset adjusting apparatus for adjusting an offset of an output signal output from an output terminal of an operational amplifier including a first input terminal to which an input signal is to be input via a first resistor and a second input terminal to which a reference voltage is to be applied, and an output terminal, a second resistor being connected between the first input terminal and the output terminal, a resistance value of the second resistor being controllable, the offset adjusting apparatus comprising:
an adjustment resistor having a controllable resistance value, the adjustment resistor having a first end to which an adjustment voltage for adjusting the offset is to be applied and a second end connected to the first input terminal of the operational amplifier;
a controlling unit configured to control the adjustment voltage applied to the adjustment resistor based on a DC level of the output signal to remove the offset; and
a gain adjusting unit configured to control the resistance value of the second resistor to set an amplitude level of the output signal to a predetermined level, and to control the resistance value of the adjustment resistor to set a ratio of the resistance value of the second resistor to the resistance value of the adjustment resistor at a predetermined value, based on the amplitude level of the output signal.

11. The offset adjusting apparatus of claim 10, wherein the controlling unit further includes:
a calculating unit connected to the operational amplifier, the calculating unit configured to calculate a target level of the adjustment voltage enabling removal of the offset of the output signal based on the DC level of the output signal; and
an adjusting unit connected to the calculating unit, the adjusting unit configured to adjust the adjustment voltage applied to the adjustment resistor to the target level calculated by the calculating unit.

12. The offset adjusting apparatus of claim 11, wherein
the controlling unit further includes an averaging unit configured to average the DC level of the output signal to be output, and wherein
the calculating unit is configured to calculate the target level of the adjustment voltage enabling removal of the offset of the output signal based on the averaged DC level of the output signal output from the averaging unit.

13. The offset adjusting apparatus of claim 12, wherein
the adjusting unit is configured to change step-by-step the adjustment voltage applied to the adjustment resistor to the target level calculated by the calculating unit.

14. The offset adjusting apparatus of claim 11, wherein
the adjusting unit is configured to change step-by-step the adjustment voltage applied to the adjustment resistor to the target level calculated by the calculating unit.

15. The offset adjusting apparatus of claim 10, further comprising:
an adjustment range controlling unit configured to control the resistance value of the adjustment resistor based on the DC level of the output signal to remove the offset of the amplified output signal.

16. The offset adjusting apparatus of claim 11, further comprising:
an adjustment range controlling unit configured to control the resistance value of the adjustment resistor based on the DC level of the output signal to remove the offset of the output signal.

17. The offset adjusting apparatus of claim 12, further comprising:
an adjustment range controlling unit configured to control the resistance value of the adjustment resistor based on the DC level of the output signal to remove the offset of the output signal.

18. The offset adjusting apparatus of claim 14, further comprising:
an adjustment range controlling unit configured to control the resistance value of the adjustment resistor based on the DC level of the output signal to remove the offset of the output signal.

* * * * *